(12) United States Patent  
Frank et al.

(10) Patent No.: US 7,965,030 B2  
(45) Date of Patent: Jun. 21, 2011

(54) LARGE-AREA OLEDS FEATURING HOMOGENEOUS EMISSION OF LIGHT

(75) Inventors: Thomas A. Frank, Niederbrechen (DE); Peter Fangyun Hsu, Taipei (TW); Edgar Boehm, Griesheim (DE); Anton Volker Heinrich, Wiesbaden (DE)

(73) Assignee: Merck Patent GmbH, Darmstadt (DE)

( * ) Notice: Subject to any disclaimer, the term of this patent is extended or adjusted under 35 U.S.C. 154(b) by 325 days.

(21) Appl. No.: 12/296,182

(22) PCT Filed: Mar. 19, 2007

(86) PCT No.: PCT/EP2007/002425  
§ 371 (c)(1),  
(2), (4) Date: Oct. 6, 2008

(87) PCT Pub. No.: WO2007/115651  
PCT Pub. Date: Oct. 18, 2007

(65) Prior Publication Data  
US 2010/0156276 A1  Jun. 24, 2010

(30) Foreign Application Priority Data  
Apr. 5, 2006  (DE) .......................... 10 2006 016 373

(51) Int. Cl.  
*H05B 33/00* (2006.01)

(52) U.S. Cl. .......................... 313/501; 313/506; 428/917

(58) Field of Classification Search .................. None  
See application file for complete search history.

(56) References Cited

U.S. PATENT DOCUMENTS

| 7,326,446 | B2 | 2/2008 | Mund et al. |
| 7,396,741 | B2 | 7/2008 | Mund et al. |
| 7,459,220 | B2* | 12/2008 | Hikmet et al. ................ 428/690 |
| 2002/0158835 | A1 | 10/2002 | Kobayashi et al. |
| 2004/0174116 | A1 | 9/2004 | Lu et al. |
| 2005/0248266 | A1 | 11/2005 | Hosokawa |

FOREIGN PATENT DOCUMENTS

| EP | 1191823 A1 | 3/2002 |
| EP | 1679939 A2 | 7/2006 |
| JP | 2003-045674 | * 2/2003 |
| JP | 2003045674 | 2/2003 |
| JP | 2003123990 | 4/2003 |
| WO | WO-03/088370 A2 | 10/2003 |

* cited by examiner

*Primary Examiner* — Ashok Patel  
(74) *Attorney, Agent, or Firm* — Connolly Bove Lodge & Hutz LLP

(57) ABSTRACT

An organic light emitting diode (OLED) comprising a substrate, a 1st electrode disposed on the substrate and including at least one lead, a 2nd electrode including at least one lead, an organic light-emitting layer disposed between the 1st electrode and the 2nd electrode, and a conductive layer. At least one of (1) the substrate and the 1st electrode and (2) the 2nd electrode are transparent. The conductive layer is disposed on one of the 1st electrode and the 2nd electrode, and effectively surrounds the light-emitting layer and the other of the 1st electrode and the 2nd electrode.

16 Claims, 3 Drawing Sheets

LARGE-AREA OLEDS FEATURING HOMOGENEOUS EMISSION OF LIGHT

Priority is claimed as a National Stage application to International Patent Application No. PCT/EP2007/002425, filed Mar. 19, 2007, which claims priority to German Patent Application No. 10 2006 016 373.7, filed Apr. 5, 2006. The disclosures of the aforementioned priority documents are incorporated herein by reference in their entirety.

BACKGROUND OF THE INVENTION

1. Field of the Invention

The field of the present invention relates to large-area OLEDs (organic light-emitting diodes) with homogeneous light emission and to processes for the production thereof.

2. Background

OLEDs have undergone rapid development in recent years. They are increasingly replacing the liquid-crystal displays (LCDs) currently employed. OLEDs have a number of advantages over LCDs: they are distinguished on the one hand by a simpler structure and by lower energy consumption. In addition, they have a smaller viewing-angle dependence.

In addition, the illumination sector is apparent as a further area of application of OLEDs. They are replacing both conventional illuminants and also LEDs here.

Compared with conventional illuminants, such as, for example, incandescent bulbs and halogen tubes, OLEDs are distinguished by a much thinner structure. In addition, OLEDs are two-dimensional illuminants, in contrast to the punctiform, conventional illuminants. This makes it possible to use OLEDs in areas of application in which conventional illuminants cannot be employed.

Compared with LEDs, OLEDs have virtually Lambert emission characteristics, i.e. there is no need to use, as in LEDs, complex optics which convert a point emitter into a two-dimensional emitter.

In addition, the electroluminescent spectrum of an OLED is very broad compared with LEDs. This enables a wide variety of colour variations of an emitter through the use of coloured filters ("colour branding"), giving rise to high potential for OLEDs in the illumination sector.

Furthermore, OLEDs have the advantage that the shape and dimension of their emitting area can very easily be adapted for specific illumination applications by structuring of the anode and/or cathode.

In spite of the above-described advantages of OLEDs, only OLEDs having very small emitting areas are currently employed, both in the display sector and also in the illumination sector. Thus, for example, OLEDs have been used for some time in displays of mobile telephones and MP3 players.

Although OLEDs should in principle be suitable for large areas owing to their Lambert emission characteristics, without additional optics, their use in illumination applications is currently restricted to small areas. It is currently not possible to provide individual OLEDs with a large emitting area which have satisfactory homogeneity of light emission over the entire emitting area. This is attributable to the fact that the size of the emitting area is restricted, inter alia, by the use of ITO ("indium tin oxide") as the preferred transparent anode material, since ITO has a relatively high surface resistance, which prevents homogeneous light emission over a large area.

Consequently, large areas currently cannot be illuminated homogeneously by a single large OLED. For this purpose, a plurality of OLEDs must at present be correspondingly arranged and provided with contacts.

SUMMARY OF THE INVENTION

The present invention relates to an OLED, preferably a large-area OLED, which has at least
   a substrate,
   a 1st electrode having at least one lead,
   at least one organic light-emitting layer, and
   a 2nd electrode having at least one lead,
   where at least either
   the substrate and the 1st electrode,
   the 2nd electrode or
   the substrate, the 1st electrode and the 2nd electrode are transparent,
   which is characterised in that at least one conductive layer is arranged between the 1st electrode and the organic light-emitting layer or the 2nd electrode and the light-emitting layer in such a way that the structure of the counterelectrode is cut out of the conductive layer, and that the conductive layer essentially surrounds the structure of the counterelectrode, where the position(s) of the at least one lead of the counterelectrode is/are cut out.

In a first embodiment ("bottom emission" OLED), the OLED has the following structure:
   a transparent substrate,
   a transparent 1st electrode having at least one lead,
   at least one organic light-emitting layer, and
   a 2nd electrode having at least one lead,
   which is characterised in that at least one conductive layer is arranged between the 2nd electrode and the light-emitting layer in such a way that the structure of the 1st electrode is cut out of the conductive layer, and that the conductive layer essentially surrounds the structure of the 1st electrode, where the position(s) of the at least one lead of the counterelectrode is/are cut out.

In a second embodiment ("top emission" OLED), the OLED has the following structure:
   a substrate,
   a 1st electrode having at least one lead,
   at least one organic light-emitting layer, and
   a transparent 2nd electrode having at least one lead,
   which is characterised in that at least one conductive layer is arranged between the 1st electrode and the organic light-emitting layer in such a way that the structure of the 2nd electrode is cut out of the conductive layer, and that the conductive layer essentially surrounds the structure of the 2nd electrode, where the position(s) of the at least one lead of the counterelectrode is/are cut out.

In a third embodiment ("transparent" OLED), the OLED has the following structure:
   a transparent substrate,
   a transparent 1st electrode having at least one lead, at least one organic light-emitting layer, and
   a transparent 2nd electrode having at least one lead,
   which is characterised in that at least one conductive layer is arranged between the 1st electrode and the organic light-emitting layer or the 2nd electrode and the light-emitting layer in such a way that the at least one conductive layer has the structure of the electrode on which it is arranged, and that the conductive layer essentially surrounds the structure of the counterelectrode, where the position(s) of the at least one lead of the counterelectrode is/are cut out.

Accordingly, an improved OLED is disclosed. Advantages of the improvements will appear from the drawings and the description of the preferred embodiment.

BRIEF DESCRIPTION OF THE DRAWINGS

In the drawings, wherein like reference numerals refer to similar components.

DETAILED DESCRIPTION OF THE PREFERRED EMBODIMENTS

Figure 1:
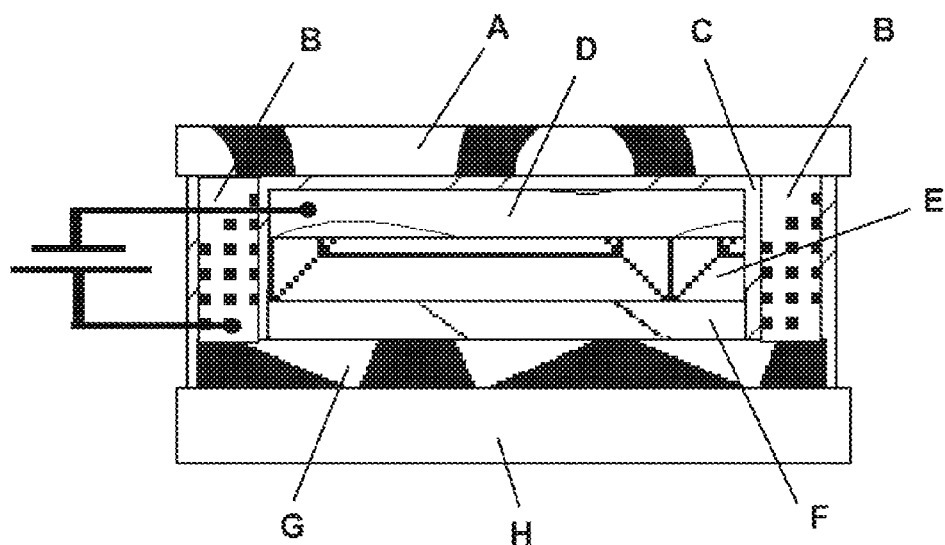
FIG. 1 illustrates a diagrammatic side view of an OLED.

Herein, large-area means a light-emitting area of at least 1 cm$^2$, preferably at least 3 cm$^2$. From such light-emitting areas, the problem of inhomogeneity owing to the high resistance of the electrode material plays a role which cannot be neglected.

However, it should be noted in this connection that the problem of inhomogeneity is also dependent on the absolute luminous density, since, owing to Ohm's law, the drop in voltage increases proportionally over the length of the electrode in the case of a relatively large driving current.

In the mentioned embodiments, either the 1st electrode can be formed as anode and the 2nd electrode as cathode, or vice versa, where the first-mentioned alternative represents the preferred embodiment.

In the preferred embodiment in which the 1st electrode is formed as anode and the 2nd electrode as cathode, the cathode has at least one lead, particularly preferably two leads. The two leads are very particularly preferably on opposite sides of the area formed as electrode, in particular on the two sides which have the greatest separation from one another. If the cathode has at least two leads, it arises therefrom that the metal layer arranged on the anode, in which the structure of the cathode is cut out and which essentially surrounds the structure of the cathode, where the positions of the two leads of the cathode are cut out, has two part-areas which are separated from one another. Consequently, the anode preferably likewise has at least two leads, to be precise at least one lead for each part-area.

The OLED can be provided with contacts by all methods known to the person skilled in the art. Thus, for example, electrical fixing of the OLED without mechanical fixing is possible, for example by means of FPC ("flexible printed circuit"). In a further embodiment, however, the fixing can take place both electrically and also mechanically, for example by means of plugs.

In the above-mentioned embodiments, an encapsulation is particularly preferably additionally arranged on the 2nd electrode, to be precise on the side opposite the light-emitting layer. In the first preferred embodiment ("bottom emission" OLED), the encapsulation can be transparent, semi-transparent or non-transparent. In the second and third preferred embodiments, the encapsulation is transparent or semi-transparent, preferably transparent.

For the purposes of this description, "transparent" means that the material has a light transmission of >60 to 100% at least in part-regions, but preferably in the entire region, of visible light, semi-transparent means that the light transmission is in the range from 20 to 60%, and non-transparent means that the light transmission is in the range from 0 to <20%.

It has been found that the arrangement described herein of the at least one conductive layer, preferably the at least one metal layer, enables the homogeneity of light emission from the OLED to be significantly improved.

In addition, the OLEDs can also be addressed in different ways owing to their arrangement, for example via individual addressing, series connection or matrix connection.

Suitable materials for the at least one conductive layer, which is preferably a metal layer, are all materials known to the person skilled in the art for this purpose. However, preferred materials for the at least one conductive layer are noble metals, such as, for example, gold (Au), silver (Ag) and copper (Cu), but it is also possible to employ conductive polymers. The conductive layer, preferably the metal layer, is preferably applied here in layer thicknesses of less than 1 μm in order to remain compatible for the subsequent processes, such as, for example, spin coating. In the present application, "conductive" is taken to mean "electrical current-conducting".

The layer resistance of the conductive layer, preferably the metal layer, should be lower here than the layer resistance of the electrode material employed, for example the ITO preferably employed as anode material. The layer resistance here is particularly preferably in the range from 1 to 3 ohm/square. It should be noted in this connection that the layer resistance of the conductive layer is highly dependent on the later application. The layer thickness of the conductive layer should be set here in such a way that the requisite layer resistance is achieved, but no adverse effect on the later subsequent processes arises.

In a particularly preferred embodiment, the at least one metal layer employed is a chromium (Cr) or copper (Cu) layer. The thickness of the Cr layer here is preferably in the region of 50 nm. It is employed principally as adhesion layer. The thickness of the Cu layer is preferably in the region of 500 nm. It principally has the function of the conductive layer. Both the Cr layer and also the Cu layer are preferably vapour-deposited by means of a shadow mask. In this way, a layer resistance of about 2 ohm/square can be achieved.

Substrates which can be employed are all materials which are suitable for this purpose. However, preferred substrate materials are glass and plastics, where glass is particularly preferred. The glass employed can be all possible types of glass, such as, for example, typical window glass. However, use is preferably made of flat glasses, as used in the display industry (for example soda-lime glass or alkali-free glass). Plastics which can be employed are all thermoplastics, but preferably polymers such as, for example, polycarbonate (PC), polymethyl methacrylate (PMMA), polyvinylcarbazole (PVK), polybutadienes, polyethylene (PE), polyethylene terephthalate (PET) and polyesters. For "top emission" OLEDs, it is also possible to employ metallic substrates, such as, for example, metallic foils. The thickness of the substrate here is preferably in the range from 0.05 to 3 mm, particularly preferably in the range from 0.2 to 1.1 mm.

The materials employed for the preferably transparent anode are preferably indium tin oxide (ITO) or also other metal oxides, such as, for example, indium zinc oxide (IZO) or aluminium zinc oxide (AlZnO), but also doped versions of the said oxides (for example fluorine-doped ITO). In addition, a semi-transparent, thin metal layer is also conceivable as anode or, in the case of the "top emission" OLED, also a non-transparent anode.

The organic light-emitting layer can have either so-called "small molecules" or polymers as light-emitting materials. Materials which can be employed here are all materials which are known to the person skilled in the art and are suitable for this purpose. It is also possible, on use of a plurality of light-emitting materials, for these to be arranged in one or more organic light-emitting layers (so-called "multi layers").

In addition, the OLEDs can have further functional layers, which can vary depending on the application. Thus, for example, hole-conductor, electron-conductor, injection and/or barrier layers are conceivable. These may preferably be present, but are not absolutely necessary.

In a preferred embodiment, the OLEDs have at least one hole-conductor injection layer. This is arranged directly on the at least one light-emitting layer on the anode side. It can consist of all materials known to the person skilled in the art for this purpose. However, preferred materials are PEDOT (poly(3,4-ethylenedioxythiophene)) and PANI (polyaniline).

In a further preferred embodiment, the OLEDs have at least one electron-conductor injection layer. This is arranged directly on the at least one light-emitting layer on the cathode side. It can likewise consist of all materials known to the person skilled in the art for this purpose. However, preferred materials are calcium, barium and lithium fluoride.

The materials employed for the non-transparent or semi-transparent cathode are preferably metallic materials, such as, for example, Al, Ag, Au or Cr. In a particularly preferred embodiment, two-layer systems (bilayers) comprising a thin layer of Ba, Li, LiF, Ca or Mg and a layer of a metal are vapour-deposited. The materials employed for transparent or semi-transparent cathodes, for example for "top emission" OLEDs or transparent OLEDs, are preferably transparent or semi-transparent cathode materials, such as, for example, ITO.

The encapsulation employed can be all materials which are suitable for this purpose. However, preferred encapsulation materials are glass and plastics, where glass is particularly preferred. The glass employed can be all possible types of glass, such as, for example, typical window glass. However, use is preferably made of flat glasses, as used in the display industry (for example soda-lime glass or alkali-free glass). Particular preference is given to the use of so-called vapour-deposition glasses, as disclosed, for example, in WO 03/088370 A1. Plastics which can be employed are all thermoplastics, but preferably polymers such as, for example, polycarbonate (PC), polymethyl methacrylate (PMMA), polyvinylcarbazole (PVK), polybutadienes, polyethylene (PE), polyethylene terephthalate (PET) and polyesters. However, it is also possible to employ metallic foils as encapsulation. In the simplest case, the encapsulation can consist of a single encapsulation layer, but it is also possible to build up the encapsulation from a plurality of layers. The total thickness of the encapsulation here is preferably in the range from 1 μm to 3 mm, particularly preferably in the range from 5 μm to 1.1 mm.

A process for the production of the OLEDs described above is characterised in that a 1st electrode having at least one lead, at least one organic light-emitting layer and a 2nd electrode having at least one lead are applied to a substrate, characterised in that at least one conductive layer, preferably at least one metal layer, is applied between the 1st electrode and the light-emitting layer or the 2nd electrode and the light-emitting layer in such a way that the structure of the counterelectrode is cut out of the conductive layer, and that the conductive layer essentially surrounds the structure of the counterelectrode, where the position(s) of the at least one lead of the counterelectrode is/are cut out.

The process is described in detail below with reference to a particularly preferred embodiment. According to this, an anode is applied as the 1st electrode to a substrate, preferably glass. The anode material employed is preferably ITO. After application of the ITO, the electrode is structured by means of photolithography or other etching methods. The structuring is preferably followed by a cleaning step. This is followed by anode metallisation, for example by means of a vapour-deposition process or a sputtering process. An interim cleaning can subsequently be carried out again before a hole-injection layer, for example of PEDOT or PANI, and subsequently at least one organic light-emitting layer is applied by means of spin-coating processes or printing processes. The cathode is then applied by vapour deposition, and the OLED is subsequently encapsulated with a cover glass.

The OLEDs described herein are useable in illumination devices. The term illumination devices here encompasses, for example, general lighting and backlighting of LCDs.

It should be noted in this connection that the requirement for homogeneity of backlighting in LCDs is very high. Precisely this homogeneity is ensured by the OLEDs described herein. In addition, the flexible connection possibilities, for example individual addressing, series connection or matrix connection, give rise to the possibility of employing the backlighting by means of the OLEDs in a modular manner in large-area LCDs.

Owing to their design, the OLEDs can namely be employed both individually and also connected in series. The combination of a plurality of series connections to give so-called "matrix connections" is also possible.

EXAMPLE 1

Production of an OLED

An ITO layer with a thickness of about 130 nm is applied as anode (n=1.8) by sputtering to a glass substrate (thickness: 0.7 mm) having a refractive index of n [589 nm]~1.5. A thin anode metal layer of Cr/Cu (50 nm/500 nm) is applied to the ITO layer by means of a vapour-deposition process and using a corresponding shadow mask.

A PEDOT (poly(3,4-ethylenedioxythiophene)) layer (Baytron P AL4083) with a thickness of about 50 nm is then applied as hole-injection layer. An emitter layer ("Super Yellow" or SPW-093, Merck OLED Materials GmbH) with a thickness of about 80 nm is applied to this layer by spin coating. A thin barium layer and, on top of the latter, a thicker (about 100 nm) aluminium layer are vapour-deposited in vacuo as cathode. Finally, the OLED is encapsulated by sticking on a glass plate over the full area in order to minimise the influences of oxygen and atmospheric humidity on the OLED.

Figure 2:
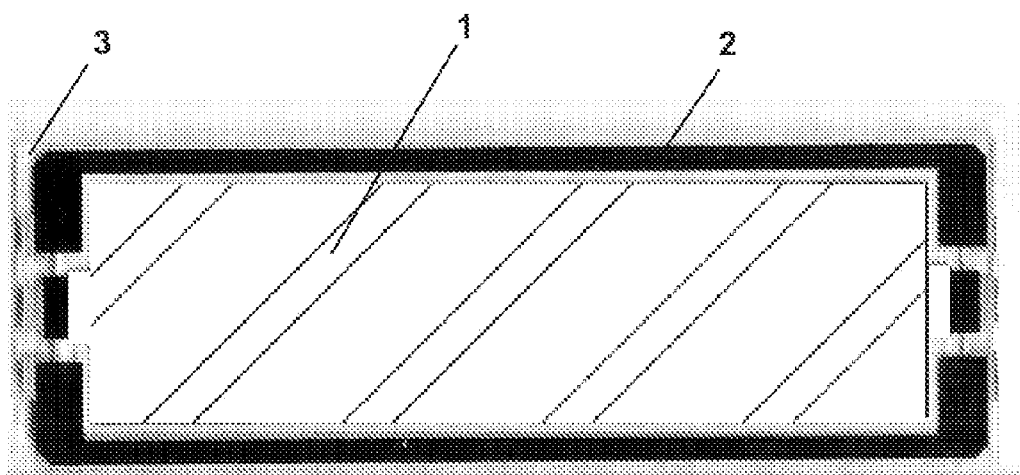
FIG. 2 illustrates a diagrammatic plan view of an OLED.

FIG. 1 illustrates the diagrammatic structure of an OLED in side view. FIG. 2 shows a plan view of an OLED.

As can be seen, in particular, from FIG. 2, the OLED has, in a particularly preferred embodiment, an axially symmetrical structure in two directions (x and y axes). A structure of this type has the following advantages:

1. The outer anode metal layer which surrounds the cathode is on the one hand a supply and transport layer which is intended to introduce the voltage into the ITO layer over the entire area in the most loss-free manner possible, resulting in more homogeneous emission, and on the other hand a contact area for possible plug systems, such as, for example, FPC (flexible printed circuit).

2. The cathode, whose structure defines the emitting area, is located in a separate layer in the centre framed by the anode metal layer.
3. The OLED can be used, for example, as individual addressing (Examples 2 and 3), as series connection ("looping-through" of the OLEDs, Example 4) or as matrix connection (Example 5).

EXAMPLE 2

Individual Connection of an OLED with Addressing on One Side

For operation of the individual OLED produced in Example 1, the latter is provided on one side with an FPC contact (FPC=flexible printed circuit). To this end, the FPC is "stuck on" by means of an ACF foil (ACF=adhesive conductive foil) in a standard method.

The FPC is constructed here in such a way that a thin, structured Cu layer is applied to a plastic support material, and a plastic layer is applied on top as cover layer. The contact areas of the FPC remain uninsulated in order to be connected to the contact areas of the OLED.

Figure 3:
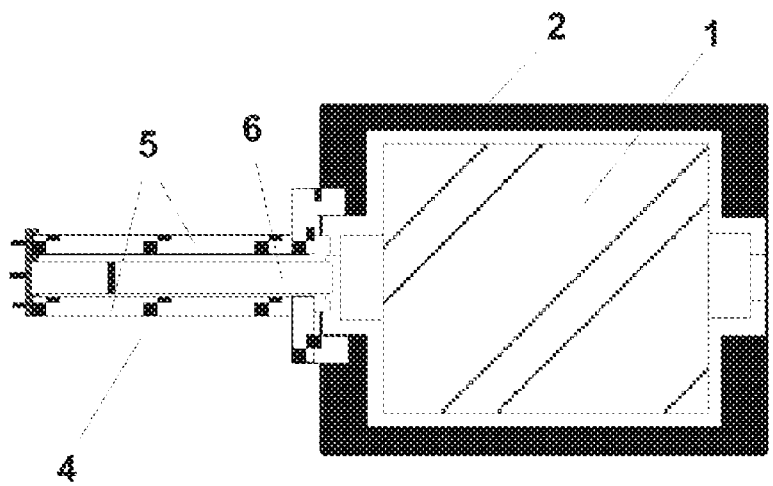
FIG. 3 illustrates the individual addressing of an OLED with contacts on one side.

FIG. 3 shows the OLED which has an FPC contact on one side. The anode metallisation in the case of addressing on one side results in uniformity of the light emission of less than 30% (definition: +/−uniformity [%]=((luminous density max-luminous density min)/2/luminous density average) *100%).

EXAMPLE 3

Individual Connection of an OLED with Addressing on Both Sides

For operation of the individual OLED produced in Example 1, the latter is provided on each of the two sides with an FPC contact (FPC=flexible printed circuit). The contacting is carried out as described in Example 2. The two FPCs are connected in parallel.

Figure 4:
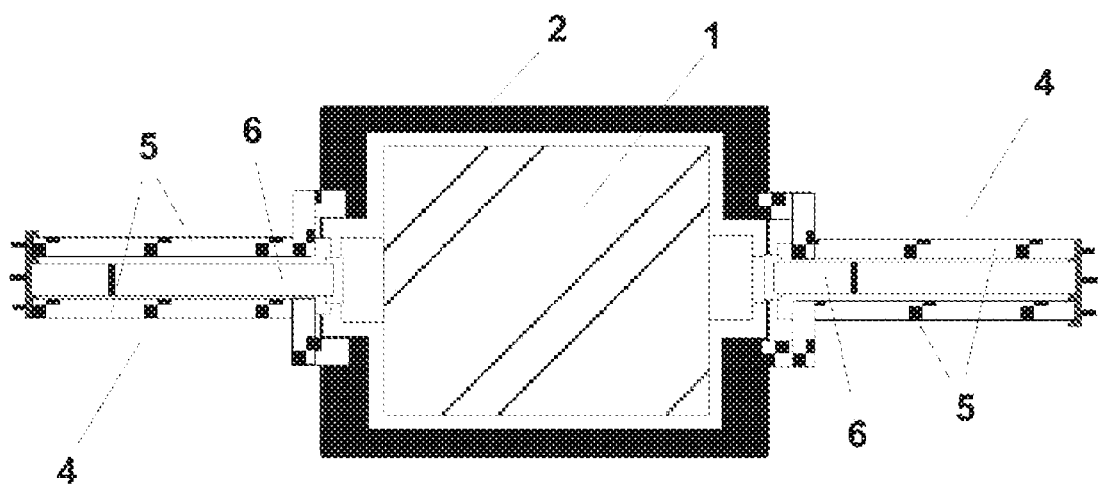
FIG. 4 illustrates the individual addressing of an OLED with contacts on both sides.

FIG. 4 shows the OLED which has FPC contacts on two sides. The FPC contacts applied to opposite sides further improves the uniformity of light emission compared with Example 2.

EXAMPLE 4

Series Connection

To this end, a plurality of OLEDs produced in Example 1 are connected in series. To this end, the individual OLEDs are connected to one another via FPCs. In each case, the cathode of an OLED is connected to the anode of the next OLED. No constructional modification of the individual OLEDs is necessary here. Only the FPCs have to be adapted correspondingly. In this way, all OLEDs are operated with the same current.

Figure 5:
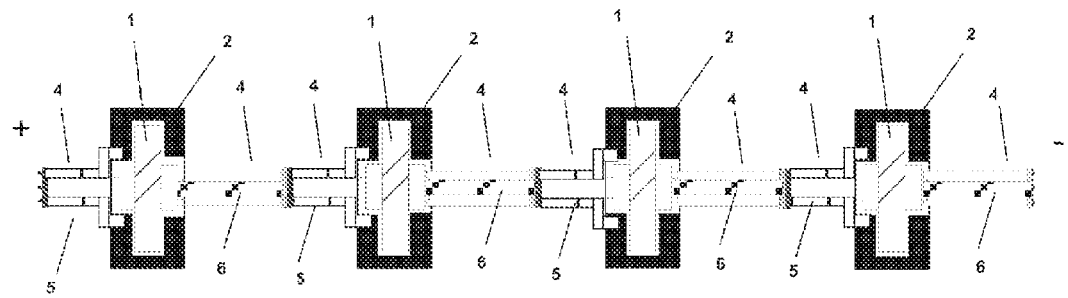
FIG. 5 illustrates several OLEDs connected in series.

FIG. 5 shows by way of example a plurality of series-connected OLEDs which are connected to one another via FPCs. Since there is a risk in the case of series connection that all OLEDs fail in the case of a contact problem, so-called shunt resistances, which, in the case of an interruption in the current in one or more OLEDs, take on the conductivity thereof, can be installed in parallel to the OLEDs.

EXAMPLE 5

Matrix Connection

To this end, a plurality of series-connected OLEDs are connected together to form a matrix. Not only the individual OLEDs, but also the various series connections, are connected to one another here by means of FPCs. The addressing here can take place either via passive matrix addressing or via active matrix addressing.

Figure 6:
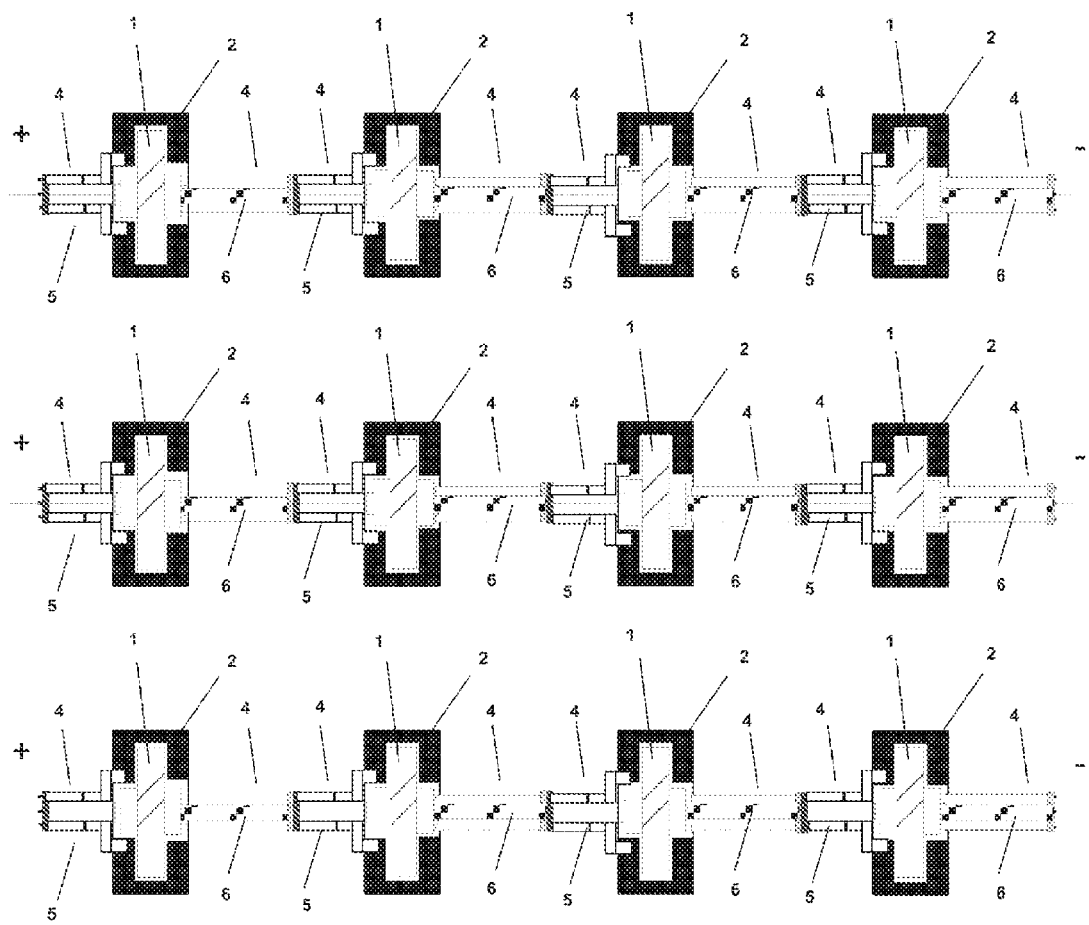
FIG. 6 illustrates several OLEDs connection in a matrix.

FIG. 6 shows by way of example a passive matrix addressing in which a plurality of series connections of OLEDs are connected in a matrix by means of FPCs.

Thus, an OLED and method of making an OLED are disclosed. While embodiments of this invention have been shown and described, it will be apparent to those skilled in the art that many more modifications are possible without departing from the inventive concepts herein. The invention, therefore, is not to be restricted except in the spirit of the following claims.

What is claimed is:

1. An organic light emitting diode (OLED) comprising:
 a substrate;
 a 1st electrode configured as an anode, disposed on the substrate, and including at least one lead;
 a 2nd electrode configured as a cathode and including at least one lead, wherein at least one of (1) the substrate and the 1st electrode and (2) the 2nd electrode are transparent;
 an organic light-emitting layer disposed between the 1st electrode and the 2nd electrode; and
 a conductive layer, which is a metal layer, disposed between the 1st electrode and the organic light emitting layer, the conductive layer effectively surrounding the 2nd electrode; and
 a hole-conductor injection layer disposed directly on the anode side of the organic light-emitting layer.

2. The OLED of claim 1, wherein the conductive layer includes one or more openings for passage of the at least one lead of the electrode effectively surrounded by the conductive layer.

3. The OLED of claim 1, wherein the substrate, the 1st electrode, and the 2nd electrode are transparent.

4. The OLED of claim 1, further comprising an encapsulation on a side of the 2nd electrode opposite the light-emitting layer.

5. The OLED of claim 1, wherein the substrate is glass.

6. An OLED comprising:
 a transparent substrate;
 a transparent 1st electrode configured as an anode and disposed on the substrate and including at least one lead;
 a transparent 2nd electrode configured as a cathode and including at least one lead;
 an organic light-emitting layer disposed between the 1st electrode and the 2nd electrode; and
 a conductive layer, which is a metal layer, disposed between the 1st electrode and the organic light emitting layer, the conductive layer effectively surrounding the 2nd electrode; and
 a hole-conductor injection layer disposed directly on the anode side of the organic light-emitting layer.

7. The OLED of claim 6, wherein the conductive layer includes one or more openings for passage of the at least one lead of the 2nd electrode.

8. The OLED of claim 6, further comprising an encapsulation on a side of the 2nd electrode opposite the light-emitting layer.

9. The OLED of claim 6, wherein the substrate is glass.

10. An OLED comprising:
   a substrate;
   a 1st electrode configured as an anode and disposed on the substrate and including at least one lead;
   a transparent 2nd electrode configured as a cathode and including at least one lead;
   an organic light-emitting layer disposed between the 1st electrode and the 2nd electrode;
   a conductive layer, which is a metal layer, disposed between the 1st electrode and the organic light emitting layer, the conductive layer effectively surrounding the 2nd electrode; and
   a hole-conductor injection layer disposed directly on the anode side of the organic light-emitting layer.

11. The OLED of claim 10, wherein the conductive layer includes one or more openings for passage of the at least one lead of the 2nd electrode.

12. The OLED of claim 10, further comprising an encapsulation on a side of the 2nd electrode opposite the light-emitting layer.

13. The OLED of claim 10, wherein the substrate is glass.

14. A process for the production of an OLED comprising:
   applying a 1st electrode configured as an anode to a substrate;
   applying a conductive layer, which is a metal layer, to the 1st electrode;
   applying an organic light-emitting layer atop the electrode conductive layer;
   applying a 2nd electrode configured as a cathode atop the light-emitting layer, wherein the 2nd electrode is effectively surrounded by the conductive layer; and
   applying a hole-conductor injection layer directly on the anode side of the organic light-emitting layer.

15. The process of claim 14, wherein applying the conductive layer includes leaving one or more openings through the conductive layer for passage of at least one lead of the 2nd electrode.

16. The process of claim 14, wherein applying the 1st electrode to the substrate includes configuring the 1st electrode as an anode.

* * * * *